(12) United States Patent
Eriksson

(10) Patent No.: US 6,798,818 B2
(45) Date of Patent: Sep. 28, 2004

(54) METHOD OF PRODUCING DISTRIBUTING REFLECTORS, AND REFLECTORS PROVIDED BY THE METHOD

(75) Inventor: Urban Eriksson, Stockholm (SE)

(73) Assignee: ADC Telecommunications, Inc., Eden Prairie, MN (US)

( * ) Notice: Subject to any disclaimer, the term of this patent is extended or adjusted under 35 U.S.C. 154(b) by 139 days.

(21) Appl. No.: 10/220,329
(22) PCT Filed: Feb. 16, 2001
(86) PCT No.: PCT/SE01/00344
§ 371 (c)(1),
(2), (4) Date: Nov. 5, 2002
(87) PCT Pub. No.: WO01/65650
PCT Pub. Date: Sep. 7, 2001

(65) Prior Publication Data
US 2003/0142717 A1 Jul. 31, 2003

(30) Foreign Application Priority Data
Mar. 2, 2000 (SE) ............................................. 0000697

(51) Int. Cl.⁷ .............................. H01S 3/08; H01S 5/00
(52) U.S. Cl. ........................................ 372/96; 372/50
(58) Field of Search .............................. 372/43–50, 96; 438/22–40; 385/14

(56) References Cited

U.S. PATENT DOCUMENTS

| 5,379,318 A | * | 1/1995 | Weber ......................... 372/96 |
| 5,497,393 A | * | 3/1996 | Lee .............................. 372/96 |
| 5,621,828 A | * | 4/1997 | Baets et al. ................... 385/14 |
| 6,658,033 B1 | * | 12/2003 | Andersson ............... 372/38.02 |

FOREIGN PATENT DOCUMENTS

| EP | 0 997 994 A1 | 5/2000 |
| WO | WO 99/22199 | 5/1999 |

* cited by examiner

Primary Examiner—Quyen Leung
(74) Attorney, Agent, or Firm—Carlson, Caspers, Vandenburgh & Lindquist

(57) ABSTRACT

A method of producing a distributed reflector that includes a grating, wherein regions (21) are provided in the grating material transversely to the longitudinal axis of the grating, wherein the refractive index in said regions is lower or higher than the refractive index in surrounding parts of the grating, and wherein the distance between mutually adjacent regions (22) is varied. The invention is characterised by giving the regions (21) mutually the same width, and determining the positions of the various regions along the longitudinal axis (X) of the grating in relation to the wavelengths to be reflected.

10 Claims, 3 Drawing Sheets

METHOD OF PRODUCING DISTRIBUTING REFLECTORS, AND REFLECTORS PROVIDED BY THE METHOD

The present invention relates to a method of producing distributing reflectors, primarily for tuneable lasers, and also to reflectors produced in accordance with the method.

Tuneable semiconductor lasers include several sections through which current is injected, these sections typically being three or four in number. The wavelength, power and mode purity of the lasers can be controlled by regulating the current injected into the various sections. Mode purity implies that the laser is at an operation point, i.e. at a distance from a combination of the drive currents where so-called mode jumps take place and where lasering is stable and side mode suppression is high.

Special requirements are placed on different applications with respect to controlling wavelength. In the case of telecommunications applications, it is necessary that the laser is able to retain its wavelength to a very high degree of accuracy and over long periods of time after having set the drive currents and the temperature. A typical accuracy in this respect is 0.1 nanometer and a typical time period is 20 years.

The distributed Bragg reflector (DBR) has played a very significant part in the development of modern semiconductor lasers. The distributed Bragg reflector enables the selection of a narrow wavelength range, therewith enabling a single longitudinal oscillation mode to dominate strongly, which means, in turn, that the spectral width of the laser light will be very small. A multiple wavelength reflector can be created, by modifying a DBR. Any one of these wavelengths can be selected with the aid of a spectral selection mechanism, therewith producing the basis of a highly tuneable laser. There are many reasons for using tuneable lasers in wavelength-multiplexed optical networks, for instance. One use is as a backup laser for a number of other lasers of fixed wavelength. The telecommunications market places high requirements on the components used. A tuneable laser must therefore provide a comparable alternative to a laser of fixed wavelength. The reflector is a very important part of the laser, where enhanced reflectance is highly significant to component performance.

It is known to construct a grating reflector with multiple reflection peaks. The Fourier relationship between, the perturbation of the waveguide and the reflection spectrum has been used as a tool in this respect. A sample distributed Bragg reflector can therewith be identified as a possible way of achieving simultaneous reflections of a number of narrow peaks and different wavelengths.

The use of frequency-modulated uniform gratings to create a suitable reflector design has also been proposed. A reflector having multiple wavelengths is obtained by producing a series of two or more identical frequency modulated gratings. A reflector of this kind is called a superstructure grating (SSG).

Another method referred to as the binary superimposed grating (BSG) has recently been presented. This method lacks the SSG superstructure.

In the BSG method, the magnitude of a design function is used to determine whether or not the waveguide shall include a material having a low index or a material having a high index.

The contribution of this method to known technology lies in the binary approach with a constant s, where s is a distance in which the refractive index has a constantly high or low value, and also in the selection mechanism for a high and a low index.

The method implies the use of a grating that includes a number of grooves or lines where the width of the grooves varies between different grooves and where all grooves have a width which is a multiple of s, and where the distance between mutually adjacent grooves also varies with a multiple of s. Thus, both groove width and groove interspacing vary.

This variation in groove width makes manufacture difficult.

An object of the present invention is to enable a grating of this kind to be produced in a much simpler way.

Accordingly, the present invention relates to a method of producing a distributed reflector which includes a grating and which is a multiple wavelength reflector, and in which method the grating is provided with regions (21) in the grating material that lie transversely to the longitudinal axis of the grating and in which the refractive index is either lower or higher than in a surrounding part of the grating and where the distance between mutually adjacent regions can be varied, wherein the method is characterised by causing said regions to have mutually the same width, and by determining the positions of the different regions along the longitudinal axis of the grating in relation to the wavelength to be reflected.

The invention also relates to a reflector of the kind that has the characteristic features set forth in claim 7.

The invention will now be described in more detail with reference to exemplifying embodiments thereof and also with reference to the accompanying drawings, in which FIG. 1 is a partially cut-away perspective view of a DBR FIG. 2 is a sectional view of a tuneable Grating Coupled Sampled Reflector (GCSR) laser;

Figure 1:
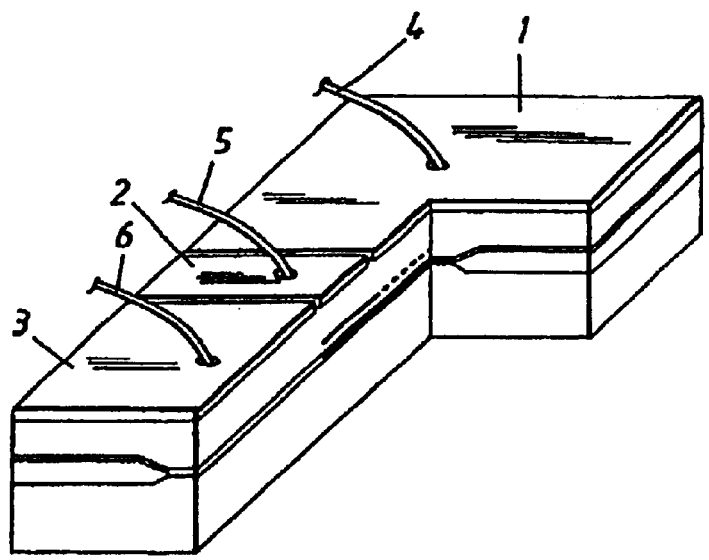

FIG. 1 illustrates a DBR laser which includes three sections, namely a Bragg reflector 1, a phase section 2 and a gain section 3. Each section is controlled by injecting current thereinto through respective electrical conductors 4, 5, 6.

Figure 2:
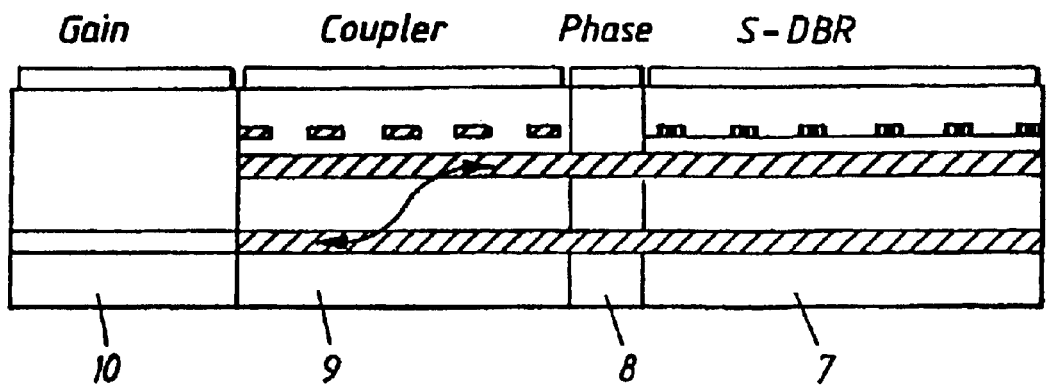

FIG. 2 is a section view of a tuneable Grating Coupled Sampling Reflector (GCSR) laser. Such a laser has four sections, namely a Bragg reflector 7, a phase section 8, a coupler 9 and a gain section 10. Each of the sections is controlled by injecting current thereinto.

Figure 3:
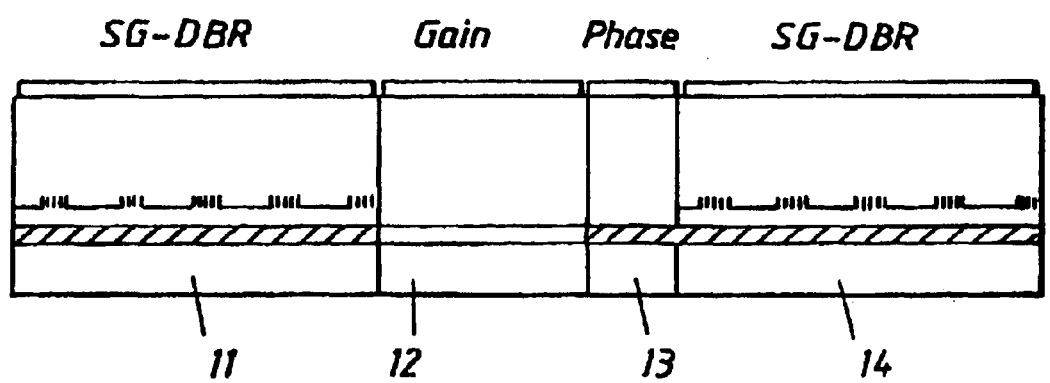
FIG. 3 is a sectional view of a Sampled Grating DBR laser.

FIG. 3 is a section view of a Sampled Grating DBR laser, which also has four sections referenced 11, 12, 13, 14 respectively. The sections 11 and 14 are Bragg reflelctors, whereas section 13 is the phase section and section 12 the gain section.

The aforesaid three types of lasers are common. However, other types of lasers exist.

The invention is not restricted to the use of the reflector with any particular type of tuneable semiconductor laser, but can be applied with tuneable lasers of kinds other than those described and shown by way of example in the accompanying drawings.

As before mentioned, the inventive method concerns the production of a distributed reflector, primarily for a tuneable, laser, which includes a grating which is a multiple wavelength reflector, wherewith the grating is provided in the grating material with regions that lie transversely to the longitudinal axis of the grating, wherein the refractive index in said regions is lower than or higher than the refractive index of the surrounding material, and wherein the distance between mutually adjacent grooves can be varied.

According to one preferred embodiment of the invention, said regions consist of physical grooves in the grating material.

According to another embodiment, said regions are produced by irradiating the grating material in a known manner, such as to change the refractive index in the irradiated regions, for instance with the aid of ultraviolet light.

According to one preferred embodiment, the reflector is integrated with a tuneable laser which can be tuned to any wavelength selected from the wavelengths that can be reflected.

The inventive reflector is not, however, restricted for use together with a tuneable laser. For instance, the inventive distributed reflector can be used as a component in the implementation of advanced filter functions in, for instance, a tuneable channel-drop filter for which there is chosen for reflection one wavelength from several incident wavelengths.

Figure 4:
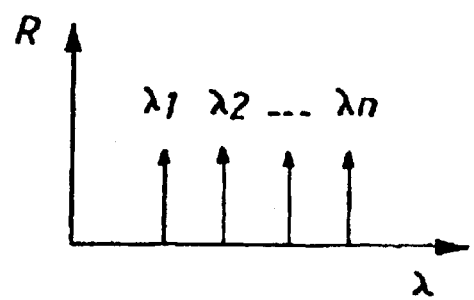
FIG. 4 is a diagrammatic illustration of reflectivity as a function of wavelength.

FIG. 4 illustrates schematically the reflectivity R as a function of the wavelength λ of such a reflector. Tuning to a particular wavelength that is included in said wavelengths is achieved by adjustment of the currents injected into the different sections of the laser or by adjustment of the voltage across said different sections.

According to the invention, the grooves or lines are given mutually the same width and the positions of the different grooves along the longitudinal axis of the grating are determined in relation to those wavelengths to be reflected.

The present invention is thus grounded on the possibility of producing a wavelength-selective reflector of the present kind simply by varying the width of the ribs defining the grooves instead of varying both the width of the ribs and the width of the grooves.

Figure 5:
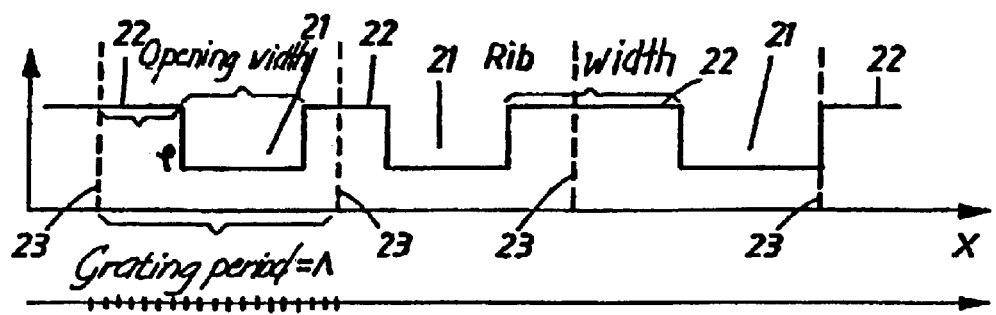
FIG. 5 is a longitudinal sectioned view of part of a grating.

FIG. 5 is a longitudinal sectioned view of part of an inventive grating where the aforesaid regions are comprised of physical grooves. FIG. 5 shows grooves 21 of mutually identical widths. Also shown are ribs 22 between the grooves 21. These ribs 22 have mutually different widths, depending on the wavelengths to be reflected. The boundaries of the grating periods are shown in vertical broken lines 23.

In one highly preferred embodiment of the invention, the positions of the grooves 21 along the grating are determined in the following way.

A grating that consists of an optical conductor with a sinusoidal disturbance in refractive index in the longitudinal direction reflects mainly light in a narrow spectral area whose centre wavelength is dependent on the disturbance period according to λ=2n Λ, where λ is wavelength, n is the mean refractive index and Λ is the disturbance period (hereinafter called the grating period).

One simple way of constructing a grating that reflects a multiple of wavelengths, is to superpose analogously a plurality of sinusoidal disturbances with mutually varying grating periods. Such a grating can be described very generally by the following function:

$$f(x) = \sum_{j=1}^{N} a_j \exp\left[i\left(\frac{2\pi x}{\Lambda_j} + \Psi_j\right)\right]$$

where the true index refractive disturbance is obtained by the true part of the function f(x). In the formula, N is the number of wavelengths where reflection is desired, x is the longitudinal position in the grating, $a_j$ designates selective true coefficients, $\Lambda_j$ is the grating period of the wavelength j, and where $\Psi_j$ designates selective phases.

Assume that the grating has a total length $L_g$ that is an integer multiple of any selected grating period which, for instance, can be sent to the centre wavelength of the reflector, i.e. $L_g$=Nlines*$\Lambda_0$, where $\Lambda_0$ is hereinafter referred to as the fund amental period of the grating and Nlines is a whole number.

The sinusoidal index disturbance described by the fundamental period of the grating along the length of said grating is taken as a starting point. A single grating period, i.e. the interval in the X-direction described by [(k-1)*$\Lambda_0$, k*$\Lambda_0$], where k is an integer belonging to [1,Nlines], accommodates precisely one period of the sinusoidal disturbance. When the index disturbance is Fourier-expanded over said interval, the spectrum is caused to include solely one fundamental tone with no harmonics. It is now possible to introduce a phase shift $\phi_k$ on the sinus function over the k:nth interval. This can assume values between 0 and $2\pi$ and corresponds to a physical displacement of the position of the index disturbance. An attempt is now made to imitate the function f(x) with a grating that has the fundamental period and with the aid of all phase shifts $\phi_k$. This is achieved by Fourier series expansion of the function f(x) over the k:nth interval [(k-1)*$\Lambda_0$, k*$\Lambda_0$]. The phase shift $\phi_k$ of the fundamental tone in the Fourier series expansion is then determined. The result is a grating that has the fundamental period $\Lambda_0$, which is phase shifted piecemeal so as to resemble f(x) and thereby obtain the desired reflection properties.

Finally, the refractive index disturbance is identified in a production process that is more like a square wave that has a higher and lower refractive index than a sine wave. In this case, the transition between the two wave configurations is clarified by arranging a distance that is equal to half a fundamental period of lower refractive index at the position where the sine function has a minimum. This results in a favourable situation in which the groove width in the grating is constant.

Figure 6:
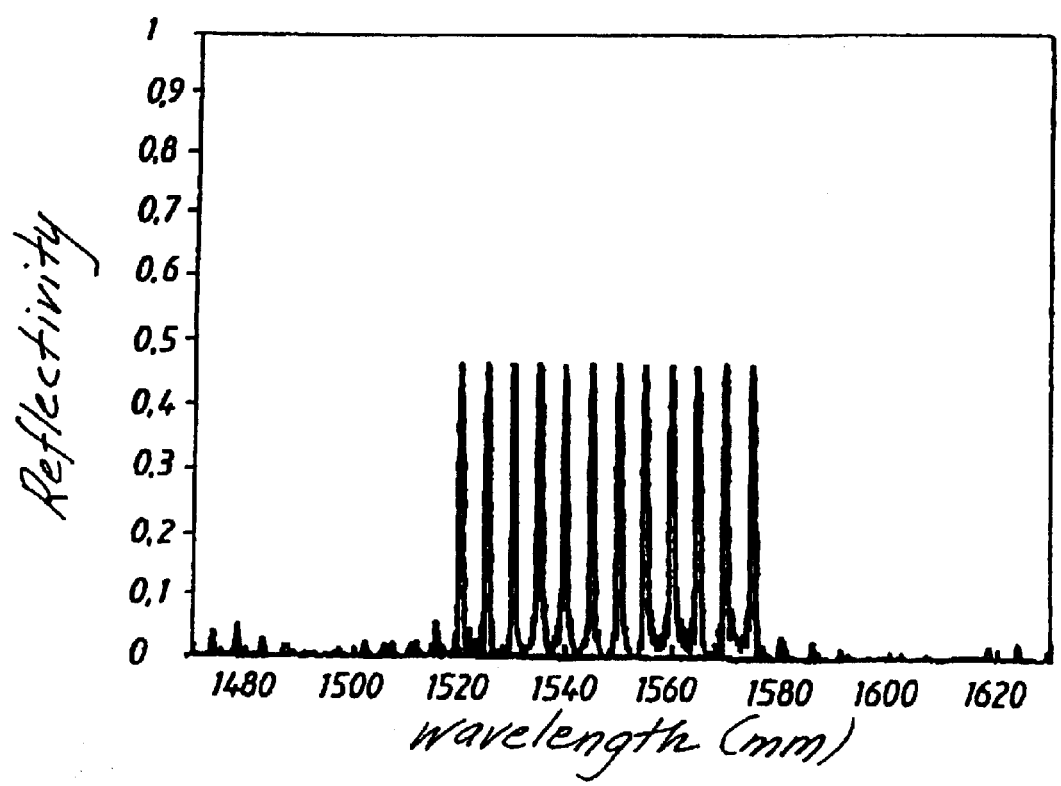
FIG. 6 is a diagram in which reflectivity is plotted against wavelength in respect of a communications laser in which the invention is applied.

FIG. 6 illustrates by way of example reflectivity as a function of wavelength when an inventive reflector is used. It is thus possible to produce a complete channel plane for communications purposes, where reflectivity is essentially equally as good for all selective wavelengths.

According to one preferred embodiment, openings are formed in a substrate-mounted resist with the aid of an electron beam in a known manner, said openings having a width that corresponds to the width of said regions or areas 21, whereafter the resist is either etched or irradiated with light.

The invention also relates to a reflector of the aforesaid kind in which the grooves or lines have mutually the same width and in which the various grooves have different positions along the longitudinal axis of the grating corresponding to the wavelengths to be reflected.

It will be obvious that the inventive method enables reflectors to be produced in a much simpler way than is possible with known techniques, owing to the fact that grooves of solely one width need be produced.

Although the invention has been described above with reference to several embodiments, it will be understood that the method of calculating the positions of the grooves can be varied.

The present invention is therefore not restricted to the aforedescribed embodiments, since variations can be made within the scope of the accompanying claims.

What is claimed is:

1. A method of producing a distributed reflector that includes a grating, wherein regions are provided in the grating material transversely to the longitudinal axis of the grating, wherein the refractive index in said regions is lower or higher than the refractive index in surrounding parts of the grating, and wherein the distance between mutually adjacent regions is varied, comprising giving the regions mutually the same width, and determining the positions of the various regions along the longitudinal axis (X) of the grating in relation to the wavelengths to be reflected.

2. A method according to claim 1, comprising applying a design function that is a super position of spatial harmonics:

$$f(x) = \sum_{j=1}^{N} a_j \exp\left[i\left(\frac{2\pi X}{\Lambda_j} + \Psi_j\right)\right]$$

where N is the number of wavelengths, x is length, $a_j$ designates selective coefficients, $\Lambda_j$ designates the grating period for wavelength j, and where $\Psi$ designates selective phase shifts, and where $\Lambda_0$ is any selected grating period that preferably corresponds to the centre wavelength of the reflector; and Fourier series expanding the function over the interval $[(k-1)*\Lambda_0, k*\Lambda_0]$, where k is a whole number belonging to [1,Nlines], where Nlines is the number of grating periods for determining the phase of the fundamental tone; and determining phase shift $\Psi_k$ from the fundamental tone, and determining the position of an associated grating opening, i.e. said regions, from said phase shifts.

3. A method according to claim 1, further comprising forming the reflector as an integral part of a tuneable laser which can be tuned to any one wavelength selected from those wavelengths that can be reflected by the reflector.

4. A method according to claim 1, further comprising giving said region the form of physical grooves.

5. A method according to claim 1, further comprising giving said regions the form of regions that have been irradiated so that the refractive indexes in said regions will be lower or higher than the refractive index of the surrounding grating material.

6. A method according to claim 1, further comprising forming in a substrate-mounted resist with the aid of an electron beam openings that have a width which corresponds to the width of said regions, and thereafter etching or irradiating said resist.

7. A distributed reflector which includes a grating and which is a multiple wavelength reflector, wherein the grating includes in the grating material regions that lie transversely to the longitudinal axis of the grating and which have a refractive index which is lower or higher than the refractive index of the surrounding part of the grating and where the distance between mutually adjacent regions is varied, wherein the regions have identical widths; and in that the regions have mutually different positions along the longitudinal axis (X) of the grating corresponding to the wavelengths to be reflected.

8. A distributing reflector according to claim 7, wherein the reflector is an integral part of a tuneable laser, wherein the laser can be tuned to any one of the wavelengths that can be reflected by the reflector.

9. A distributing reflector according to claim 7 wherein the regions comprise physical grooves.

10. A distributing reflector according to claim 7 wherein said regions comprise regions that have been irradiated to cause the refractive index of said regions to be lower or higher than the refractive index of the surrounding grating material.

* * * * *